United States Patent [19]

Millham et al.

[11] Patent Number: 4,696,005

[45] Date of Patent: Sep. 22, 1987

[54] APPARATUS FOR REDUCING TEST DATA STORAGE REQUIREMENTS FOR HIGH SPEED VLSI CIRCUIT TESTING

[75] Inventors: Ernest H. Millham, Catlett, Va.; John J. Moser; John J. Shushereba, both Essex Junction; Gary P. Visco, Hinesburg, all of Vt.

[73] Assignee: International Business Machines Corporation, Armonk, N.Y.

[21] Appl. No.: 740,592

[22] Filed: Jun. 3, 1985

[51] Int. Cl.$^4$ ............................................. G01R 31/28
[52] U.S. Cl. ....................................................... 371/27
[58] Field of Search ............................ 371/20, 25, 27; 324/73 R, 73 AT, 73 PC

[56] References Cited

U.S. PATENT DOCUMENTS

| | | | |
|---|---|---|---|
| 3,873,818 | 3/1975 | Barnard | 371/25 |
| 4,070,565 | 1/1978 | Borrelli | 371/20 |
| 4,291,404 | 9/1981 | Steiner | 371/20 |
| 4,418,388 | 11/1983 | Allgor et al. | 364/431.01 |
| 4,433,414 | 2/1984 | Carey | 371/27 |
| 4,598,245 | 7/1986 | Groves et al. | 324/73 R |

Primary Examiner—Charles E. Atkinson

[57] ABSTRACT

Apparatus for applying for a plurality of test cycles data specifying a plurality of test conditions to a multiple pin electronic circuit. A random access memory includes at a plurality of higher order addresses a complete data field for a plurality of test cycles. Some of said data fields include an operational code indicating that a minority of data bits in a field are to change in a consecutive number of following test cycles. A hold register is connected to receive each addressed row of test data from the memory. The higher order addresses of a memory addressed to produce complete data fields in the hold register. An operational code will be decoded to indicate a number of subsequent consecutive test cycles where a minority of data in the hold register are to be changed. The lower order addresses of the memory are subsequently addressed for a number of consecutive test cycles indicated by the operational code. The data contained in the lower order memory addresses is inserted in the hold register without changing the contents of a majority of hold register data bits.

9 Claims, 5 Drawing Figures

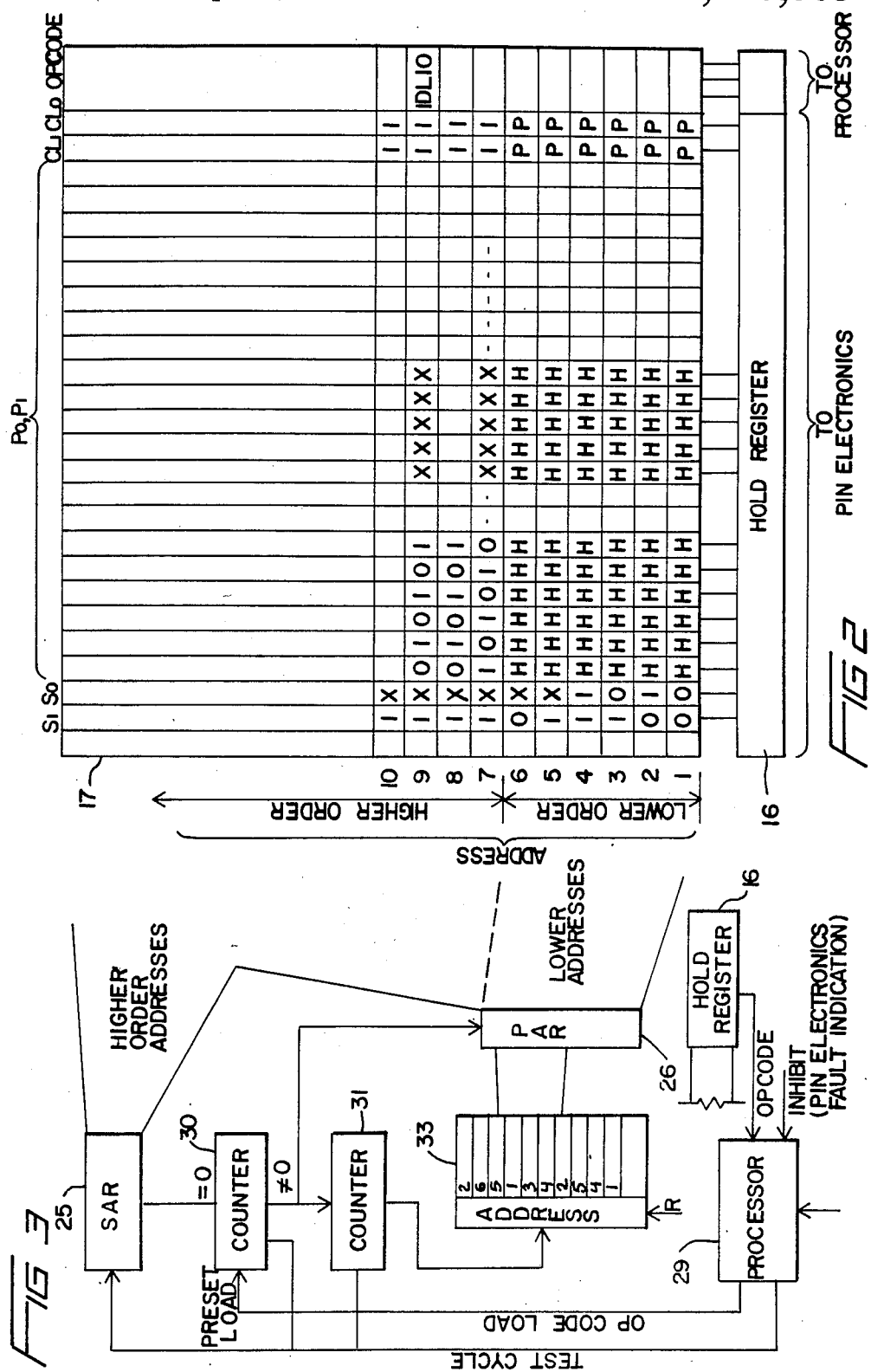

APPARATUS FOR REDUCING TEST DATA STORAGE REQUIREMENTS FOR HIGH SPEED VLSI CIRCUIT TESTING

BACKGROUND OF THE INVENTION

The present invention relates to high speed VLSI circuit testing. Apparatus is provided for reducing the memory requirements of an integrated circuit tester. Specifically, a programmable buffer memory is disclosed which provides an architecture which can change a minor number of bits of a test data field while maintaining the remaining data bits the same.

Multiple pin electronic circuit devices have grown in complexity to include in one VLSI structure 20,000 different logic blocks. The present course of developments suggests that VLSI structures will in the future include 100,000 logic blocks. Testing of VLSI structures requires that the circuits be activated, and a plurality of tests performed at a rate which will permit high volume testing. As a minimum, current VLSI structures require approximately 100,000 cycles of test data to be applied. For instance, a VLSI structure of 20,000 logic blocks may include 16 pins of external connections. To test such a device, one byte of information for each pin may be necessary, and 100,000 separate bytes necessary to completely test the structure. As such, to arrange test data in a memory for successive application to the VLSI structure requires storage of approximately $1.6 \times 10^6$ bytes of information. Both the loading of these quantities of data and reading out the loaded test data will require in a conventional memory a run time which reduces the overall throughput of the testing system.

The prospect of larger VLSI structures increases the number of test cycles exponentially. As such, the data requirements for such VSLI structures increases the memory storage requirements exponentially, incurring still further delays in reading in and out test data for testing a given device.

Attempts to reduce the total amount of data required in a high speed testing device are disclosed in U.S. Pat. Nos. 3,873,818 and 4,291,404. The system of U.S. Pat. No. 3,873,818 provides for efficient storage of serial test patterns in a tester memory which is configured for parallel patterns. The patented system is efficient for shift register strings with a length equal or nearly equal to the number of bits per word in the tester memory. As the difference between the number of bits per word and length of a tested shift register string changes, the data compaction provided by the patented technique is less.

U.S. Pat. No. 4,291,404 provides a program method for storing character sets which represents only changes from a previous set. The system of the U.S. Pat. No. 4,291,404 does not compact the test data itself but rather provides for an improved method for uniquely identifying characters which are to change.

The present invention provides for yet another technique for compacting test data such that overall memory storage requirements are reduced, avoiding the lengthy delays of loading and unloading expensive memories.

SUMMARY OF THE INVENTION

It is an object of this invention to reduce the size of test data memory requirements in large scale computer testing systems.

It is yet another object of this invention to provide test data compaction by changing only that portion of a data field which changes between test cycles.

It is a more particular object of this invention to provide for a test data memory which can change a minority of bits in a data field of test data while maintaining the remaining data bits the same for subsequent test cycles.

These and other objects of the invention are provided by a high speed programmable buffer memory. The buffer memory is selected to have an output width sufficient to accommodate one cycle of testing of a typical VLSI circuit device. The memory width is further divided into three distinctive portions containing the most frequently changing data, the remaining data, and an operational code for controlling addressing of the high speed buffer memory.

The buffer memory, in a preferred embodiment of the invention, stores in a majority of higher order memory addresses a complete field of test data and also includes additional data bit space for an operational code. In a minority of lower order addresses of the memory, only the most frequently changing data bits of a test cycle are stored. These data bits are stored at a position in the field corresponding to the position of data in a higher order address which they are to replace. The sequence of data removal from the buffer memory during testing begins with the first higher order address to contain a complete test data field. Each address following the initial higher order address is sequentially read out at each test cycle into a hold register. The hold register applies the read out data to pin electronics which establishes test conditions on each pin of a device under test.

The presence of an operation code in an addressed test data field signifies that only a minority of the test data are to change for one or more following test cycles. As such, the operation code will specify that data stored in the lower order addresses will be substituted for a minor number of test data while the remaining data field in a higher order address is to remain the same.

In order to address the lower order addresses of the memory containing the most frequently changing data of a minority number of data bits, a repeat buffer is enabled. The repeat buffer has preprogrammed therein the address of the lower order bits to be newly inserted in a data field. The repeat buffer will, under control of the operation code, address, in accordance with a programmed sequence for each of the following test cycles identified by the operation code, a new set of the most frequently changing data bits. The lower order addresses contain in bit locations having data which is not to change data which will cause the hold register contents having a position corresponding to this data not to change.

The compaction achieved with the foregoing test memory is most advantageous in testing LSSD devices. These devices include a minority of SHIFT IN, SHIFT OUT pins, and a larger majority of combinational logic pins. The test data for applying to the pins of these devices is stored in the memory. As the combinational logic data, PI PO for the combinational logic pins remains the same for many test cycles, this data is stored in the higher order addresses of the memory with an initial SO and SI data. The more frequently changing SI, SO data for the SHIFT IN, SHIFT OUT pins which repeats for many of the test cycles, is stored in the lower order memory addresses. During execution of the higher order addresses in sequence, the presence of an operational code with the full data field of a test cycle will shift memory addressing to the lower order memory addresses. For a number of following test cycles identified by the operational code, the repeat buffer will sequentially address new SI SO data contained in the minority of lower order addresses, having a position in the data field common with the position of data it is to replace. As such, new SI SO data will replace, for the subsequent test cycles identified by the operational code, the old SI SO data. The remaining data bits in the lower order addresses having a position corresponding to data which is not to change is decoded by the hold register as a "don't change" indication.

The foregoing architecture of storing in a minority of lower order addresses of the memory data which changes most frequently and which is repetitive, can reduce the overall memory requirements for testing LSSD structures by 80%. As such, the present invention provides for an improved test time for carrying out LSSD structure testing on an automated basis.

DESCRIPTION OF THE FIGURES

FIG. 2 is a schematic illustration of the memory organization of a tester buffer memory.

FIG. 3 is a block diagram of the processor for controlling memory addressing.

DESCRIPTION OF THE PREFERRED EMBODIMENT

Figure 1:
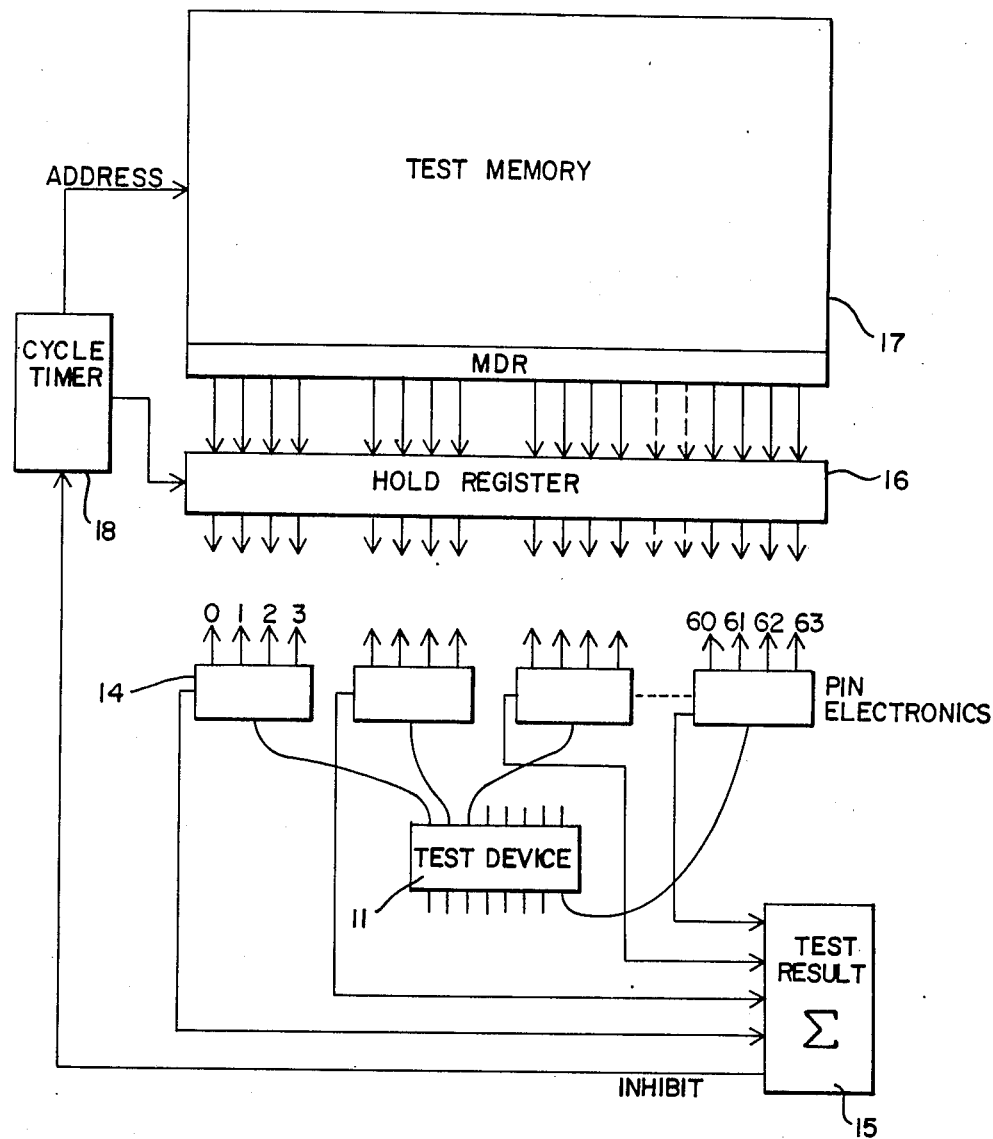
FIG. 1 is an illustration of a test apparatus for testing LSSD circuits.

Referring to FIG. 1, there is shown the overall system block diagram for A VLSI testing apparatus. The test device is shown as a 16 pin conventional integrated circuit pack 11, having a plurality of input/output pins. Each of the input/output pins requires a connection during testing such that the appropriate test condition can be applied or sensed on a given pin of the device.

As is conventional in automatic circuit testing devices, a plurality of pin electronics modules 14 associated with each pin of the device under test, will either apply or sense the appropriate test condition to the test device 11.

These conditions are either input or output conditions, representing either a state to be applied to a pin or a state to be sensed on a given pin of the test device.

The following input conditions are commonly found to be required in testing VLSI structures. In particular, these input conditions and output conditions are utilized in testing LSSD logic structures.

| INPUT CONDITIONS | OUTPUT CONDITIONS |
|---|---|
| F0 Force "0" | E1 Expect 1 |
| F1 Force "1" | E0 Expect 0 |
| P1 Pulse "1" | EX Expect Nothing |
| P0 Pulse "0" | E3 State Expect |
| F OFF Nothing on pin | State Between "1" and "0" |

As seen from the foregoing conditions to be asserted or sensed on each pin of the device under test, a four bit binary number is needed for each pin under test. Referring again to FIG. 1, it is seen that the four bit binary number is applied to the pin electronics modules 14, at which point the appropriate level is either sensed or applied to a pin dedicated for a given pin electronics module 14. In the case where a condition is to be sensed, when the appropriate output condition has not been sensed, the result is applied by the pin electronics 14a to the testing console 15. Testing may be inhibited and the particular data test noted as to which pin failed for a given testing cycle.

Each testing cycle for the device under test includes a data field addressed by a test cycle timer 18 which will specify four data bits for each of the pin electronics associated with the device under test. As such, a 64 bit data field is provided each test cycle to a HOLD register 16 and applied to the device under test. In conventional data testing, the test memory 17 capacity would be required to provide a row of test data for each test cycle to be carried out. This leads to the previously mentioned drawback of excessive test memory 17 capacity requirements, with the attendant delays incurred from loading data into memory 17 as well as reading the data out. In large scale integrated circuit testing, a test cycle is advantageously no more than 20 nanoseconds. The test memory size becomes very significant when trying to keep the time for completing a test to a minimum.

The test data words which are applied to the pin electronics in each test cycle contain 64 bits as shown, but in larger structures may contain as much as 1,000 bits or more. In the LSSD circuit structures, only a small set of these bits are required to change from test cycle to test cycle. Typically, the majority of the pins are devoted to the combinational logic as primary inputs PI and primary outputs PO. Once the PI and PO conditions have been established on the respective pins, the remaining minority of pins which are devoted to effecting a shifting through the device under test, are changed. During the testing of the shift register, the data can be compacted by maintaining the PI and PO input/output conditions at the same state, while changing the state of the SI and SO pins. Since the SI and SO states are repetitive, and have only a limited number of states, typically 0, 1 and X, for a total number of states as is

POSSIBLE SI STATES 0, 1=2

POSSIBLE SO STATES 0, 1,X=3

The total number of logical conditions that can occur on multiple numbers of shift register strings of an LSSD structure is expressed as $SI^n \times SO^n$ where SI equals the number of possible SI states and SO equals the number of possible SO states, and n equals the total number of shift register strings. As such, for n equals 1 through 4, the total number of logical conditions that can occur on a shift register string is for n=1 to 4, 6 through 1296.

For one shift register string of an LSSD structure, a total of 6 logic conditions are necessary to represent all of the SO SI states necessary to test the device. Referring to FIG. 2, there is shown how these six conditions may be stored in the lower order addresses 1 through 6 of a data memory. A complete data test cycle data field is included in the higher order addresses beginning at 7.

The memory 17 organization in accordance with FIG. 2 shows a data field for each memory row which includes PO, PI data, clock data, as well as SI, SO data.

Additionally, an operation code is shown as part of the data field in the higher order memory locations.

The lower order memory 17 addresses include data which is to be changed between test cycles in columns designated SI, SO. These data occupy column addresses identical to the data that they are to replace in the higher order addresses. The remaining columns of the lower order memory addresses include 'don't change" data bits. These data have an identity which is used to inhibit changing the hold register 16 contents which correspond to those columns occupied by the "don't change" data. Therefore, when rows 1-6 are addressed, the hold register 16 will only change data bits in only those bit locations which receive SI, SO data. In practice, this may be carried out by including in the hold register decoding circuitry which will not permit loading of those data locations which receive "don't change" data from memory 17.

The addressing of the memory 17 of FIG. 2 begins on an initial address of 7. As such, the entire data field for PI PO, clocks, and SI, SO are transferred from the memory 17 and loaded in a hold register 16.

Each of the higher order addresses following address 7 is subsequently addressed at the completion of one test cycle. Each row of the memory contents for the higher order addresses represents test data for one test cycle. As the higher order address memory contents are exercised, and the contents placed in the hold register, an operational code will be detected for address 9 indicating that the PI and PO data is to be maintained constant, while changing the SO, SI data in in subsequent test cycles. A processor connected to decode the operational code contained in the hold register 16 will subsequently command a repeat buffer 33 to read out the contents of addresses 1 through 6 in a preprogrammed order for a number of consecutive test cycles identified by the work operand associated with the operational code.

Reading out the contents of addresses 1 through 6 will only change those data bits of the data field representing SI and SO. The remaining portion of the data field in addresses 1 through 6 will contain data which is unrecognizable to the hold register. As such, the H bits shown in FIG. 2 will not cause the hold register to change state for those bits. The clock bits contained in the data field 1 through 6 are identical to each other but typically different from those in the high order data field.

It is possible to change the SI, SO data to any one of the states shown in addresses 1 through 6. As was previously mentioned, for a simple LSSD structure having a single shift register string, these total 6 states represent all of the conditions for SI, SO.

By dividing the data memory into the lower order addresses, having the repetitive, most frequently changing data SI SO, a compaction of the total data requirements can be achieved. This compaction may be explained by $$\frac{Ct + P}{(C + B)t}$$

where C is the number of tests when PIs and POs are changed, B equals the number of bits shifted (the length of the longest shift string), t equals the number of times to repeat the sequence, and P equals the number of possible combinations of SI and SO, as identified above. For example, a typical LSSD structure, where C equals 3, B equals 150, t equals 1,000 and P equals 6, it can be seen that about 2% of the high speed memory is required over that normally used. However, additional low speed memory will be required consisting of 56,250 bytes. The low speed memory is necessary to contain the sequence in which the lower order addresses are to be read out in order to exercise the SI, SO inputs of the shift register.

Once the operational code found in a given row of data has been decoded, and the sequential test cycles represented by the operation code work operand are executed, return of the addressing to the next of the higher order addresses is effected and a sequence of higher order addresses is continued to be executed, until another operational code returns control of the tester to address data in the lower order addresses.

To effect control over addressing of the memory of FIG. 2, the addressing is separated as shown in FIG. 3 into a high order memory address register, the SAR 25, and a low order address register, PAR 26. The work operand portion of the operational code, which is decoded by processor 29 from the main memory, is used to indicate the number of sequential addresses which are to be executed in the lower order address addresses of the memory. As such, the operational code work operand is set in counter 30. The presence of a number, not equalling 0 in the counter, will inhibit indexing the SAR 25 at the last address to executed.

Each subsequent test cycle will decrement the counter 30. Additionally, a second counter 31 is incremented by each subsequent test cycle pulse.

The counter 31 will produce a new address for addressing a memory 33 containing, in sequence, the lower order addresses of memory 17 for each subsequent test cycle of a number of cycles identified in the counter 30 by the operational code work operand. The output from the memory 33 is loaded in the PAR 26 address register, whereby the specifically identified contents of the lower order memory addresses of memory 17 are supplied to the hold register 16.

When the first counter 30 has decremented to zero, indicating that the repetitive data bits for the SO and SI pins have been retrieved for the operational code work operand previously set in the counter, the counter contents having reached zero, will permit the SAR to address additional higher order memory addresses in sequence.

As such, it is clear how the lower order memory addresses may be utilized to change only a minor number of bits of the data field for a number of test cycles identified by the operational code. The address of those following sequential test cycles for the bits to be changed is included in the repeat buffer memory 33. As it requires three bits to identify addresses 1 through 6, the memory needs to be a 3 bit wide memory. Additionally, when the PAR 26 is enabled, it applies to the higher order address a zero state, thus inhibiting the SAR 25 from addressing the higher order addresses. After counter 30 has been decremented to zero, addressing by SAR 25 will commence until the entire contents of the memory 17 have been read out into the hold register and testing completed.

Figure 4:
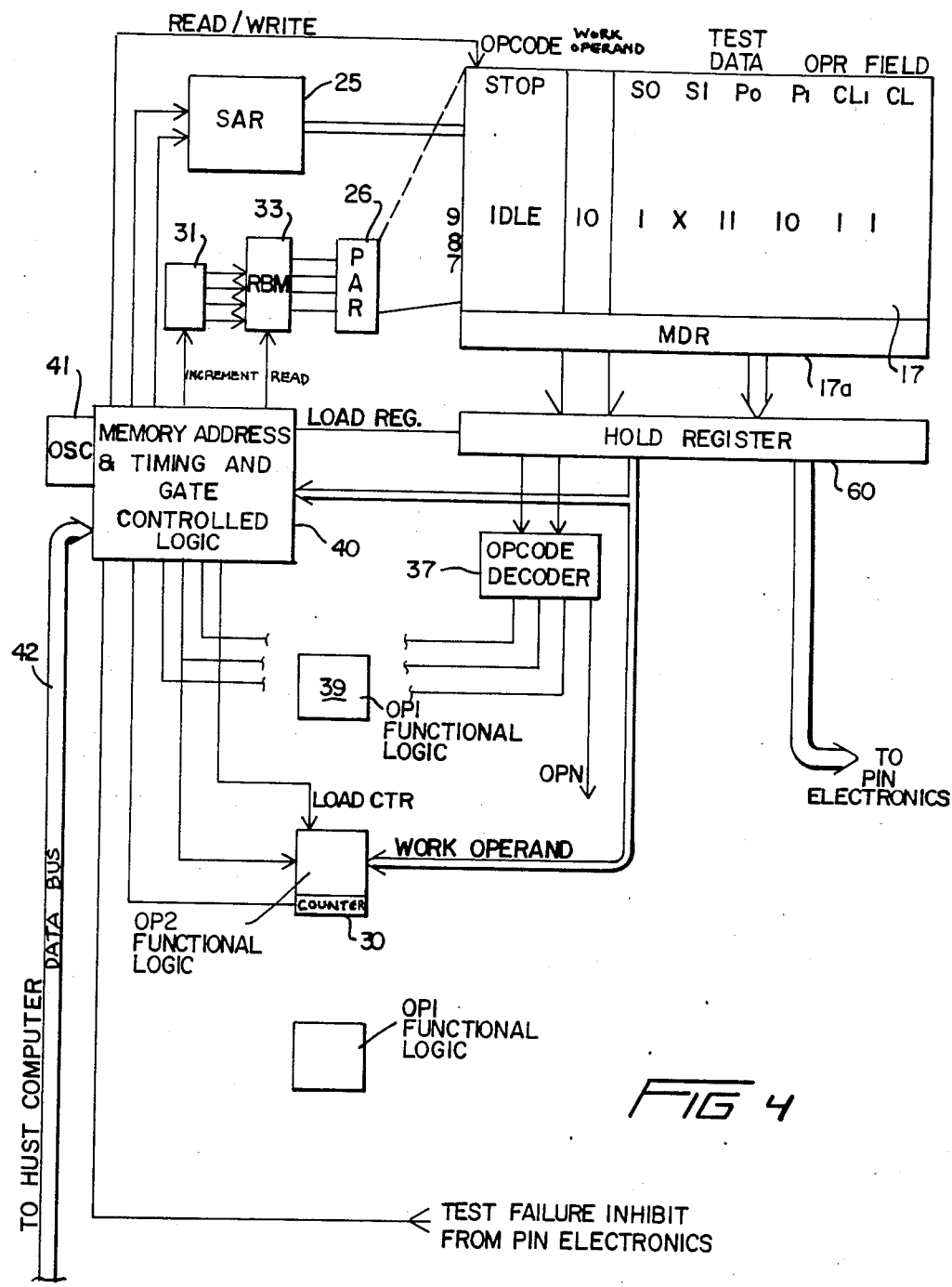
FIG. 4 is a block diagram of the test memory and processor for controlling data addressing.

A high speed programmable buffer for storing and executing test data and associated operation codes is shown in FIG. 4. The architecture of this high speed programmable buffer memory is analogous to that described in the IBM Technical Disclosure Bulletin, Volume 18, No. 12, May 1976, modified to include the data and operational code format previously described.

The high speed programmable buffer memory of FIG. 4 includes a high speed random access memory 17 which is typically an integrated bipolar transistor random access memory. A plurality of such memories are cascaded to provide the required data capacity.

The processor of FIG. 4 is streamlined from that of the aforesaid IBM Technical Disclosure Bulletin in that only one type of operational code is necessary to carry out the reading out of test data, and switching control of the processor from the higher order addresses to the lower order addresses. The type of operational code stored in the memory 17 is identified by function as an IDLE operation code, including a work operand number. The IDLE code, when decoded by the operational code decoder 37, will inhibit further addressing of the random access memory 17. The operational decoder 37 provides gate signals to the memory address and timing and gate control logic 40. A work operand associated with the IDLE op code is, in response to the gate signals produced from the decoder 37, entered into a counter 30, shown as a portion of the functional logic. Thus, a load counter signal is produced from the memory address and timing and gate control logic 40 upon the decoding of the IDLE op code.

The programmable buffer of FIG. 4 need only execute the one simple type of op code. As such, the work operand is merely confined to a number to indicate a number of consecutive test cycles for which lower order address data is to be applied to the hold register.

The high speed programmable buffer of FIG. 4 will receive test data and op code data from a host computer from bus 42. Additionally, a starting address will be provided along with a start code to begin addressing memory 17 at the first higher order address containing a full field of test data. In accordance with the previously described testing system of FIG. 2, this would constitute the address 7 of memory 17.

Figure 5:
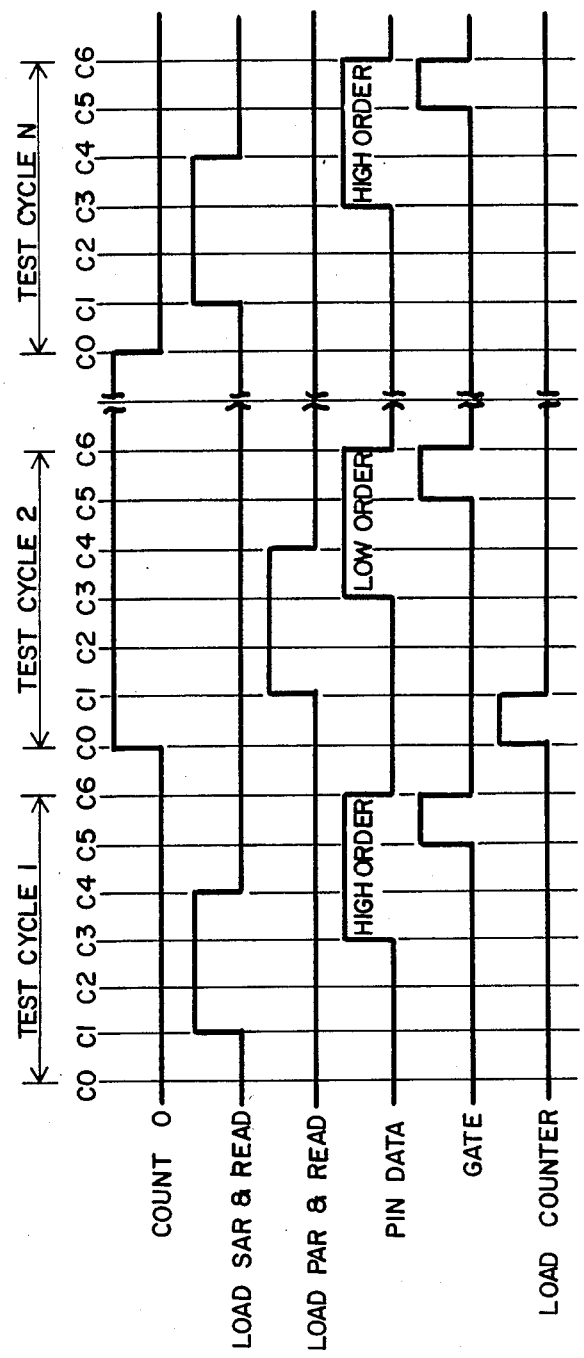
FIG. 5 is a timing diagram demonstrating the timing signals which control addressing of the lower order address contents of the buffer memory.

The processor of FIG. 4 contains in memory all the given data necessary to perform a designated command of the op code. Hence, upon decoding of an IDLE command, the op decoder 37 and timing and gate control logic need only load the work operand 10 into counter 30. Once having loaded the work operand, the repeat buffer memory 33 may begin supplying lower order memory addresses to the PAR 26. The PAR 26 will force the higher order addresses connected to the SAR 25 into a zero or non-reading state while addressing memory locations 1–6. The test cycles of preferably 20 nanoseconds for the 64 bit data field is generated by an oscillator 41. During this test cycle, various timing signals are provided by the memory address and timing and gate control logic which will cause data to be read from the memory 17, load the hold register 30, index the repeat buffer memory address counter 31, as well as decrement the counter 30 contained in the functional logic portion of the processor. Referring now to FIG. 5, the 20 nanosecond test cycle is shown divided into six sub-time intervals representing timing signals provided by the memory address and timing gate control logic 40.

Test cycle 1 shows the counter 30 in a zero condition during Cφ, thus causing the addressing or memory 17 from SAR 25 and initiating a read of memory 17, Following the read of memory 17 the operational code is decoded during C3–C4 and the operand (count) is loaded in counter 30, SAR 25 is incremented during C6.

During Cφ of test cycle 2 the counter 30 is not zero causing the addressing of memory 17 from PAR 26 and initiating a read of memory 27 from the low order addresses. Counter 30 is decremented and counter 31 is incremented during C6.

As shown in test cycle N control is returned to SAR 25 when counter 30 is equal to zero.

The operational code is produced at the output of memory 17, along with the new data bits during the interval C3–C5.

The remaining portions of FIG. 5 demonstrate the timing for decoding an operational decode, and loading counter 30 when the decoded operational code indicates an IDLE state. Thus, when addressing higher order addresses, and an operational IDLE code is generated, the counter 30 will be loaded in interval Cφ, and pin data will be loaded during C5 in the hold register 16.

Thus, each higher order address of the memory 17 addressed in sequence by the SAR 25 will be checked to determine whether an op code and associated work operand is included therein. Upon the detection of the IDLE op code, op code decoder 37 will gate the associated work operand into the counter 30. For a number of test cycles identified by the contents of counter 30, the repeat buffer 33 address inputs will be indexed by counter 31. When a number of lower order addresses, corresponding to the original counter 30 contents have been exercised, and the associated data read into the hold register 16, control will return to the SAR 25. At the last memory address for memory 17 which contains active test data, an operational code corresponding to a STOP indication is stored rather than the IDLE code used in earlier memory locations. The STOP code, when countered by the op code decoder 37, will inhibit further addressing of memory 17 as the entire test data field has been read from memory 17 and applied to the pin electronics.

If, during any time a test data field produces a failure indication from the pin electronics, an INHIBIT will be applied to the memory address and timing gate controlled logic 40 to stop testing of the device.

Thus, there has been described with the respect to one embodiment a type of processor and high speed memory which will result in a reduction in memory requirements in automatic high speed testing of VLSI circuits as required. The foregoing system, although particularly advantageous with LSSD structure, wherein for a number of tests only a minimum number of data bits in a test field change, other VLSI circuit components, which also include in a plurality of test data fields, a minority of data bits which change, may be advantageously tested with the foregoing apparatus and method.

Each operational code found in the buffer memory will identify a sequence of lower order addresses to be exercised on the repeat buffer memory. Shown in the Figure are ten consecutive lower order addresses included in the repeat buffer memory, which will provide for a sequence identified by the operational code work operand 10 in address 9. Other operational code work operands, as they are encountered in executing the higher order addresses, will be loaded in the counter 30 and counter 31 will begin addressing the memory 33 from address 11 which contains the first of the next sequence of addresses for memory 17.

What is claimed is:

1. In an automatic testing system, apparatus for supplying test data for a plurality of test cycles identifying test conditions for a multipin electronic circuit, comprising:

a random access memory having a plurality of higher order addresses identifying a plurality of memory rows containing a complete field of test data, some of said rows containing an operational code specifying a number of subsequent test cycles over which a minority of data in said rows are to change without changing the remaining data of the row, and having a smaller number of lower order addresses which contain data in the same position within the data field as said minority of data;

means for sequentially addressing each of said higher order addresses;

a repeat buffer for sequentially addressing said lower order addresses;

a hold register for receiving each row of addressed data in said memory and for outputting test data identifying test conditions for a multipin electronic circuit; and processor means for indexing said means for sequentially addressing said higher order addresses and decoding each operational code received in said holding register, said processor connected to inhibit addressing by said means for sequentially addressing said higher order addresses and addressing said repeat buffer for a number of test cycles identified by said operational code whereby only said minority of data bits in said holding register having a field position corresponding to data bits in said lower order memory address change.

2. In an automatic tester for applying test data identifying test conditions to a multipin electronic circuit and determining the circuit response to said test conditions an apparatus for supplying test data for each of said cycles, comprising:

a random access memory having a first plurality of rows of data fields representing sequential test conditions for said pins, some of said rows including an operational code indicating a number of test cycles that a minority of said data in said row is to be changed, a second plurality of rows of data fields of the same length as said first plurality of rows, containing a minority of data bits to replace said minority of data for subsequent test cycles and containing data indicating the remaining data of a previously addressed row is to remain the same;

a hold register connected to receive the output of said memory and for outputting test data identifying test conditions for a multipin electronic circuit;

first and second addressing registers connected to address said first plurality of rows of data and said second plurality of rows of data;

a repeat buffer means connected to said second addressing register, said repeat buffer means including the address of subsequent test cycle data in said second plurality of rows of data; and, processor means connected to sequentially address said first plurality of rows whereby each of said first rows is sequentially loaded into said hold register, said processor means including means for decoding an operational code in said hold register and addressing said repeat buffer for a subsequent number of test cycles indicated by said operational code, whereby said minority of data from said second plurality of rows of bits are substituted for a minority of data bits in said hold register; and, the contents of a majority of test data bits in said hold register are held constant during a subsequent number of test cycles identified by said operational code.

3. In an automatic testing system, apparatus for applying a plurality of test cycles, data specifying a plurality of test conditions to a multiple pin electronic circuit for determining a response to said test conditions comprising:

a random access memory having a plurality of memory rows for storing data in a field, the higher order addresses of said memory including complete cycles of test data and an operational code, and a minority of lower order addresses including less than a complete test data field of the most frequently changing data common to many of said test cycles;

a hold register connected to receive each addressed row of test data in said memory and for outputting test data identifying test conditions for a multipin electronic circuit;

means for addressing each of said higher order addresses in sequence, whereby complete data fields of said memory are loaded in said hold register as well as an operational code which indicates a number of subsequent consecutive test cycles where a minority of said hold register data bits are to be changed; and, sequentially addressed second memory means for addressing said lower order memory addresses for a number of test cycles specified by said operational code, whereby said most frequently changing data is received in said holding register without changing the contents of said majority of data bits in said hold register.

4. An automatic testing system, apparatus for applying test data identifying test conditions to a multipin electronic circuit for determining a response to said test conditions comprising:

a random access memory having a plurality of higher order addresses identifying a plurality of memory rows containing a complete field of test data, some of said rows containing an operational code specifying a number of consecutive test cycles in which a minority of data in said field of test data is to change, and having in a smaller number of lower order addresses data in the same position of said field of test data as said minority of data;

a hold register for receiving each of said rows of test data and operation codes and for outputting test data identifying test conditions for a multipin electronic circuit;

a source of pulses corresponding to each test cycle;

a high order memory address register connected to address in sequence said higher order memory addresses in response to each of said pulses;

a counter connected to receive a count indicating the number of consecutive test cycles specified by said operational code, said counter connected to inhibit said higher order address register when a non-zero count is present and connected to be decremented in response to said test cycle pulses;

a repeat buffer means connected to be addressed by each of said pulses when said counter indicates a non-zero count, said repeat buffer including a sequence of lower order addresses of said random access memory which contain consecutive test cycle data to be substituted for said minority of test data;

an address register connected to address said lower order addresses in response to said repeat buffer output; and processor means connected to decode an operational code produced when said random access memory contents are received in said hold register, and connected to provide a count to said counter indicating the number of test cycles in which only said minority of test data are to be changed, whereby each succeeding pulse corresponding to a test cycle results in said repeat buffer addressing said memory replacing said minority of data in said hold register with data from said lower order addresses until said counter decrements to zero.

5. In a system for testing multipin LSSD integrated circuit structure, wherein data is produced for each test cycle defining a condition for each pin of an integrated circuit, an apparatus for producing test data for each test cycle of said integrated circuit comprising:

a programmable memory having a first group of row addressable memory locations containing a field of test data defining test conditions for each of said pins, some of said first group of memory locations of a row including an operational code defining a number of consecutive test cycles where only a minority of data bits of an associated data field are to change, a second group of row addressable memory locations containing data bits which have a position in said rows corresponding to the position of said minority of data bits;

a hold register connected to receive a row of data from said memory and apply data corresponding to said field of test data to said integrated circuit;

a first address register connected to address said higher order memory locations in sequence, whereby data from each of said higher order locations is inserted in said hold register;

a repeat buffer including a number of sequential memory locations containing a series of said lower order addresses of said memory containing data bits;

a second address register connected to address said memory in response to a data signal from said repeat buffer; and processor means connected to increment said first address register, whereby said higher order memory locations are addressed, said processor connected to detect an operational code in said hold register and to store a number defining a number of consecutive test cycles, said processor means inhibiting said first address register from incrementing during said number of consecutive test cycles, and reading from said repeat buffer for said number of test cycles said stored lower order addresses, whereby said memory contents in said second group of memory locations are applied to said hold register.

6. The apparatus of claim 5 wherein the remaining data positions in said second group of memory locations have a second group of data bits which identify bit locations in said hold register which do not change during said number of consecutive test cycles.

7. The apparatus of claim 5 wherein said minority of data bits represent the test conditions for input and output terminals SI, SO of an LSSD structure.

8. The apparatus of claim 5 wherein said first group of row addressable locations include a field of test data, a majority of data in each field corresponding to combinational logic conditions for a majority of said LSSD integrated circuit pins, and said minority of data corresponding to input/output logic conditions for a minority of said pins.

9. The apparatus of claim 6 wherein said hold register includes decoding circuitry which inhibits changing data in locations corresponding to said second group of data bits in said second group of data bits in said second group of memory locations.

* * * * *